United States Patent
Romain et al.

(10) Patent No.: US 11,509,332 B2
(45) Date of Patent: Nov. 22, 2022

(54) ERROR DETECTION

(71) Applicants: STMicroelectronics (Rousset) SAS, Rousset (FR); STMicroelectronics (Alps) SAS, Grenoble (FR)

(72) Inventors: Fabrice Romain, Rians (FR); Mathieu Lisart, Aix en Provence (FR); Patrick Arnould, Voreppe (FR)

(73) Assignees: STMicroelectronics (Rousset) SAS, Rousset (FR); STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 17/394,118

(22) Filed: Aug. 4, 2021

(65) Prior Publication Data

US 2021/0367619 A1 Nov. 25, 2021

Related U.S. Application Data

(63) Continuation of application No. 17/010,351, filed on Sep. 2, 2020, now Pat. No. 11,115,061.

(30) Foreign Application Priority Data

Sep. 4, 2019 (FR) ...................................... 1909723

(51) Int. Cl.
*H03M 13/29* (2006.01)
*G06F 11/10* (2006.01)
(52) U.S. Cl.
CPC ..... *H03M 13/2906* (2013.01); *G06F 11/1076* (2013.01)

(58) Field of Classification Search
CPC ....................... H03M 13/2906; G06F 11/1076
See application file for complete search history.

(56) References Cited

U.S. PATENT DOCUMENTS

| 6,301,682 | B1 | 10/2001 | Knefel |
| 11,115,061 | B2 | 9/2021 | Romain et al. |
| 2008/0215955 | A1 | 9/2008 | Kimbara et al. |
| 2008/0235485 | A1* | 9/2008 | Haertel ............... G06F 11/1044 |
| | | | 714/E11.041 |
| 2011/0041031 | A1 | 2/2011 | Ko et al. |

(Continued)

FOREIGN PATENT DOCUMENTS

| CH | 671123 A5 | 7/1989 |
| EP | 1679598 A2 | 7/2006 |

(Continued)

OTHER PUBLICATIONS

INPI Search Report and Written Opinion for FR 1909723 dated May 19, 2020 (7 pages).

(Continued)

*Primary Examiner* — Kyle Vallecillo
(74) *Attorney, Agent, or Firm* — Crowe & Dunlevy

(57) ABSTRACT

A datum is written to a memory, by splitting a binary word, representative of the datum and an error correcting or detecting code, into a first part and a second part. The first part is written at a logical address in a first memory circuit. The second part is written at the logical address in a second memory circuit. The error correcting or detecting code is dependent on both the datum and the logical address.

24 Claims, 5 Drawing Sheets

(56) References Cited

U.S. PATENT DOCUMENTS

| | | | |
|---|---|---|---|
| 2012/0110411 A1* | 5/2012 | Cheung | G06F 11/106 714/763 |
| 2012/0317334 A1 | 12/2012 | Suzuki et al. | |
| 2012/0317340 A1 | 12/2012 | So et al. | |
| 2015/0095572 A1 | 4/2015 | Koike | |
| 2017/0255521 A1 | 9/2017 | Asano | |
| 2017/0337103 A1 | 11/2017 | Royer, Jr. | |
| 2018/0157848 A1 | 6/2018 | Fader et al. | |
| 2018/0210787 A1 | 7/2018 | Bains et al. | |
| 2018/0225173 A1 | 8/2018 | Baek et al. | |
| 2018/0267733 A1 | 9/2018 | Xie et al. | |
| 2019/0229753 A1 | 7/2019 | Cha | |

FOREIGN PATENT DOCUMENTS

| | | |
|---|---|---|
| EP | 2095234 A1 | 9/2009 |
| EP | 2423815 A1 | 2/2012 |
| EP | 3489830 A1 | 5/2019 |
| WO | 2016144395 A1 | 9/2016 |

OTHER PUBLICATIONS

S. Sheather, M.Jones, "A reliable Data-Based Bandwidth Selection Method for Kernel Density Estimation", J. Royal Statistics Soc.B, vol. 53, pp. 683-690, 1991.

* cited by examiner

ERROR DETECTION

CROSS REFERENCE TO RELATED APPLICATIONS

This application is a continuation of U.S. patent application Ser. No. 17/010,351, filed Sep. 2, 2020, which claims the priority benefit of French Application for Patent No. 1909723, filed on Sep. 4, 2019, the contents of which are hereby incorporated by reference in their entireties to the maximum extent allowable by law.

TECHNICAL FIELD

The present disclosure relates generally to electronic systems and circuits and, more specifically, to electronic systems and circuits comprising a memory. The present disclosure still more specifically relates to the reading and writing of data in these memories and, more specifically, to the detection of errors during the reading and writing of data.

BACKGROUND

Data management, during the operation of a system, or an electronic circuit, generally requires the use of one or several memories. Operating data are, for example, written and/or read from these memories before, or after, having been used.

Many errors, or faults, can be encountered during the reading and/or writing of a datum in a memory. As an example, a reading error may consist of the reading of a datum at an incorrect address. A writing error may consist of writing a datum at an incorrect address. These errors can be accidental or deliberate. As an example, a deliberate error may be produced by a fault injection method, for example implemented by an attacker, with the aim of altering the operation of an electronic system.

It would be desirable to be able to improve, at least partially, certain aspects of methods for reading and/or writing data in memory and, more specifically, improve certain aspects of methods for detecting errors in reading and/or writing data in memory.

There is a need for more reliable methods for reading and/or writing data in memory.

There is a need for better performing methods for detecting errors in reading and/or writing data in memory.

There is a need for methods for detecting errors in reading and/or writing that are configured to detect errors in which data are written at an incorrect address.

SUMMARY

One embodiment addresses all or some of the drawbacks of the known methods for writing data in memory.

One embodiment addresses all or some of the drawbacks of the known methods for reading data in memory.

One embodiment addresses all or some of the drawbacks of the known methods for detecting errors in reading and/or writing in memory.

One embodiment provides a method for writing a datum in memory, in which: a binary word, representative of said datum and an error correcting or detecting code, is split into at least a first part and a second part; and said first part is written at a logical address in a first memory circuit; and said second part is written at said logical address in a second memory circuit configured to store as many binary words as said first memory circuit, said error correcting or detecting code being dependent on said datum and said address.

According to one embodiment, said first and second parts are of equal size.

According to one embodiment, the binary word is a concatenation of said datum and said error correcting or detecting code.

According to one embodiment, said datum and said address are supplied by a single first processor.

According to one embodiment, said datum and said address are supplied by at least one second processor and a third processor.

According to one embodiment, said datum supplied by the second processor is compared to said datum supplied by the third processor, and said address supplied by the second processor is compared to said address supplied by the third processor.

According to one embodiment, the second processor supplies said address to one of said at least two memory circuits, and the third processor supplies said address to another of said at least two memory circuits.

According to one embodiment, the second processor supplies said address to said at least two memory circuits.

According to one embodiment, said first and second memory circuits are the same size.

According to one embodiment, internal control signals of said at least two memory circuits are compared.

Another embodiment provides a method for reading a datum written according to the method disclosed above.

According to one embodiment, said binary word is formed by concatenating said first and second parts read in said first and second memory circuits.

According to one embodiment, the datum is obtained by removing the error correcting or detecting code from the binary word.

Another embodiment provides a method for detecting an error in a datum written by the method disclosed above, wherein the error correcting or detecting code is computed again from the datum read by the method disclosed above.

According to one embodiment, the error correcting or detecting code is verified.

Another embodiment provides a method for detecting a writing error of a datum in memory in which: at least two parts of equal size of a binary word representative of said datum are stored at the same address in at least two identical memory circuits; and internal control signals of the two memory circuits are compared.

According to one embodiment, the internal signals comprise a word signal.

According to one embodiment, the internal signals comprise a selection signal of one of the memory circuits.

According to one embodiment, the internal signals comprise a writing activation signal.

According to one embodiment, the internal signals comprise a selection/column number signal.

According to one embodiment, the internal signals comprise a selection/row number signal.

According to one embodiment, the binary word is obtained from said datum and an error correcting or detecting code, said error correcting or detecting code being representative of said datum and said address.

According to one embodiment, the binary word is obtained by concatenation of said datum and the error correcting or detecting code.

According to one embodiment, the error correcting or detecting code is representative of said datum and said address.

According to one embodiment, the error correcting or detecting code is obtained by a signature method.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the remainder of the disclosure, splitting, cutting or division of an initial binary word into several parts will refer to the formation of several secondary binary words from bits of the initial binary word. More specifically, each secondary binary word is made up such that the concatenation of all of the secondary binary words, in a specific order, yields the initial binary word.

Additionally, in the remainder of the description, a logical address refers to an address generated by a processor and intended for a memory circuit. This address is decoded by an address decoding circuit associated with the memory circuit and that supplies a physical circuit in terms of coordinates (row-column) in the memory plane.

Figure 1:
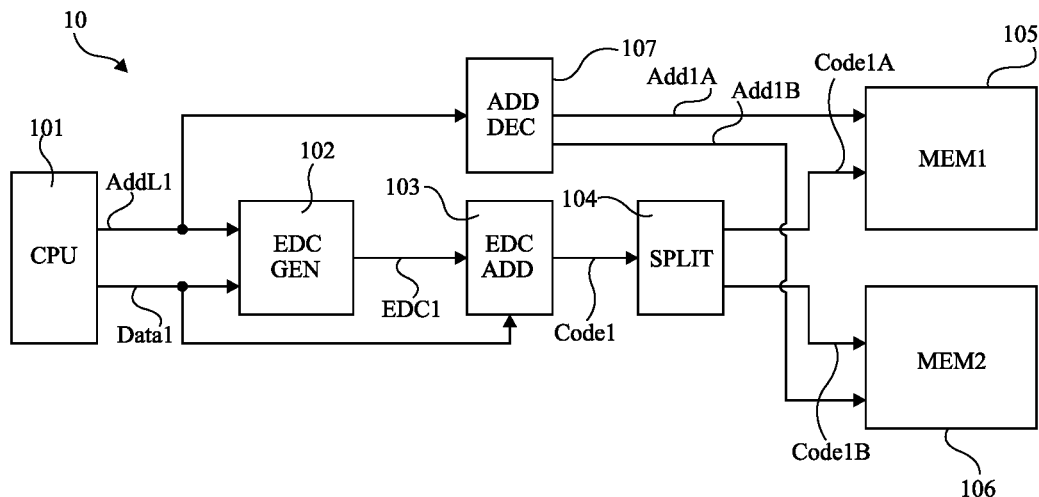
FIG. 1 shows, schematically and in block diagram form, part of an architecture of one embodiment of an electronic system.

FIG. 1 shows, schematically and in block diagram form, part 10 of an architecture of one embodiment of an electronic system 1. The part 10 is configured to write data in memory of the electronic circuit 1.

The part 10 comprises: a processor 101 (CPU); a circuit 102 (EDC GEN) for generating an error correcting or detecting code; a circuit 103 (EDC ADD) for forming a binary word; a circuit 104 (SPLIT) for dividing a binary word; two memory circuits 105 (MEM1) and 106 (MEM2); and an address decoding circuit 107 (ADD DEC).

The processor 101 is a processor configured to request the writing of data in the memories 105 and 106. The processor 101 supplies, as output, a datum Data1 to be written and a logical address AddL1. The address AddL1 is the logical address at which the datum Data1 must be written in memory. As an example, the logical address AddL1 is a binary word whose bits of high weight indicate the row of the memory circuit in which the binary word must be written, and the bits of low weight indicate the column of the memory circuit in which the binary word must be written.

The circuit 102 for generating an error correcting or detecting code is a circuit configured to compute an error detecting code (EDC) EDC1, or an error correcting code (ECC), representative of the datum Data1 and the logical address AddL1. Thus, the circuit 102 receives, as input, the datum Data1 and the logical address AddL1, and supplies, as output, the error correcting or detecting code EDC1. As an example, the error detecting code EDC1 is obtained by using a signature algorithm.

The circuit 103 for forming a binary word is a circuit configured to form a binary word Code1 representative of the datum Data1 and the code EDC1. The circuit 103 receives, as input, the datum Data1 and the code EDC1, and supplies, as output, the binary word Code1. As an example, the datum Data1 and the code EDC1 are concatenated by the circuit 103 in order to form the binary word Code1. The order in which the datum Data1 and the code EDC1 are concatenated in order to form the binary word Code1 is unimportant.

The binary word division circuit 104 is a circuit configured to split the binary word Code1 into several binary words. The circuit 104 receives the binary word Code1 as input and, in this example, supplies two binary words Code1A and Code1B as output. In other words, the concatenation of the binary words Code1A and Code1B, in a specific order, yields the binary word Code1. The binary words Code1A and Code1B, for example, have different sizes. As a variant, the binary words Code1A and Code1B are the same size, that is to say, they each comprise half of the bits of the binary word Code1.

The address decoding circuit 107 is a circuit configured to supply physical addresses readable by memory circuits from a logical address. The circuit 107 receives the logical address AddL1 as input, and supplies two physical addresses Add1A and Add1B as output. The circuit 107 more specifically makes it possible to define, from the logical address AddL1 supplied by the processor 101, the two physical addresses Add1A and Add1B at which the binary words Code1A and Code1B will be written in the memory circuits 105 and 106. As an example, the addresses Add1A and Add1B are identical.

The memory circuits 105 and 106 are configured to store the binary words Code1A and Code1B respectively at the addresses Add1A and Add1B. Thus, the memory 105 receives the binary word Code1A and the address Add1A as input, and the memory 106 receives the binary word Code1B and the address Add1B as input. The memory circuits 105 and 106 are configured to store the same number of binary words. The memory circuits 105 and 106 are, for example, volatile memories. As an example, the memory circuits 105 and 106 are the same size.

As a variant, the part 10 could comprise more than two memory circuits with an identical structure and size. In this case, the circuit 104 would be configured to supply as many binary words as there are memory circuits comprised in the part 10. In other words, the circuit 104 is configured to divide the binary word Code1 into as many parts as there are memory circuits comprised in the part 10. Additionally, the circuit 107 is configured to supply as many physical addresses from the logical address AddL1 as there are memory circuits comprised in the part 10.

A method for writing the datum Data1 implementing the part 10 of the system 1 in memory is as follows. When the processor 101 wishes to store the datum Data1 in memory, it generates the address AddL1 at which it wishes to store the datum. The processor 101 then supplies the datum Data1 and the logical address AddL1 to the circuit 102 for which the latter generates the code EDC1. In parallel, the address AddL1 is converted into two physical addresses Add1A and Add1B by the circuit 107. The datum Data1 and the code EDC1 are next used, by the circuit 103, to supply the binary word Code1. The binary word Code1 is then divided into two parts, the two binary words Code1A and Code1B by the circuit 104. The binary words Code1A and Code1B are stored, respectively, in the memory circuit 105 and in the memory circuit 106 at the addresses Add1A and Add1B. Thus, the datum Data1 is stored in the memory circuits 105 and 106, in the form of binary words Code1A and Code1B.

Figure 2:
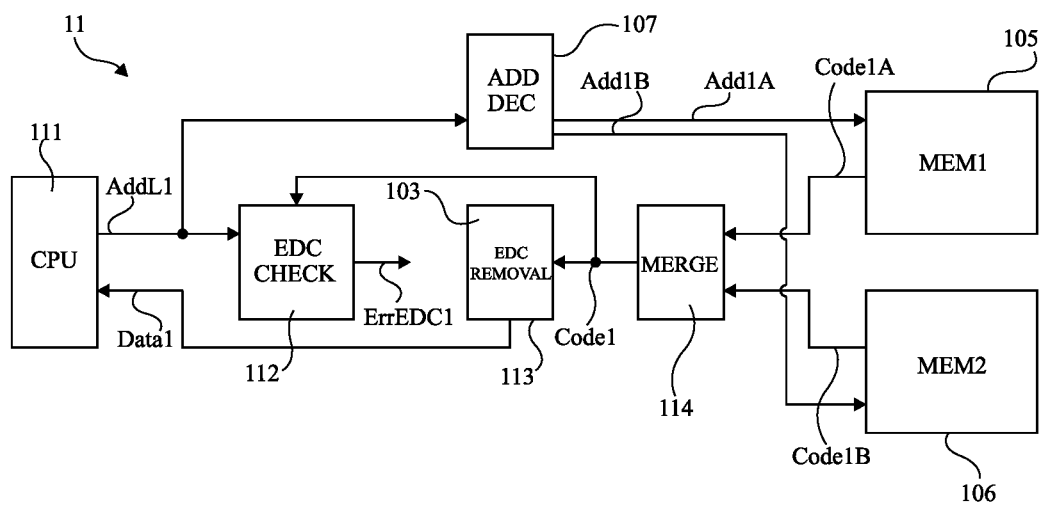
FIG. 2 shows, schematically and in block diagram form, another part of the architecture of the system of FIG. 1.

FIG. 2 shows, schematically and in block diagram form, another part 11 of the architecture of the embodiment of the electronic system 1, the part 10 of which is described in relation with FIG. 1. The part 11 is configured for writing data in memories of the electronic system 1. More specifically, in FIG. 2, the part 11 is configured to read the datum Data1 written at the address AddL1 as described in relation with FIG. 1.

The part 11 comprises: a processor 111 (CPU); a circuit 112 (EDC CHECK) for checking an error correcting or detecting code; a circuit 113 (EDC REMOVAL) for recovering a datum; a circuit 114 (MERGE) for concatenating binary words; the two identical memory circuits 105 (MEM1) and 106 (MEM2); and the address decoding circuit 107 (ADD DEC).

The processor 111 is a processor configured to request the reading of data in the memories 105 and 106. The processor 111 supplies an address, for example the logical address AddL1 described in relation with FIG. 1, as output, and receives a datum corresponding to the address, that is to say, the datum Data1 described in relation with FIG. 1, as input. The processor 111 is, for example, the same processor as the processor 101 described in relation with FIG. 1, but as a variant, the processor 111 can be a separate processor from the processor 101 described in relation with FIG. 1.

The circuit 112 for checking an error correcting or detecting code is a circuit configured to check the code EDC1 associated with the datum Data1. The circuit 112 receives the binary word Code1 and the logical address AddL1 as input, and supplies an error signal ErrEDC1 as output. To check the code EDC1, the circuit 112 finds, from the binary word Code1, the datum Data1 and the code EDC1. Next, the circuit 112 computes a new error detecting or correcting code from the datum Data1 and the address AddL1 supplied by the processor 111. The new code is then compared to the code EDC1. If they are the same, then there is no error. If they are not, then there is an error. Any error is indicated by means of the signal ErrEDC1. The circuit 102 disclosed in relation with FIG. 1 is, for example, part of the circuit 112, but as a variant, the circuits 102 and 112 can be separate circuits.

The data recovery circuit 113 is a circuit configured to recover the datum Data1 from the binary word Code1. The circuit 113 receives the binary word Code1 as input, and supplies the datum Data1 as output. As an example, when the binary word Code1 is a concatenation of the datum Data1 and the code EDC1, the circuit 113 is configured to truncate the code EDC1 of the binary word Code1, and thus to keep only the datum Data1. The circuit 113 and the circuit 103 described in relation with FIG. 1 can, for example, be part of a same circuit, or as a variant can be two separate circuits.

The binary word concatenation circuit 114 is a circuit configured to find the binary word Code1 from two binary words Code1A and Code1B. Thus, the circuit 114 receives the binary words Code1A and Code1B as input, and supplies the binary word Code1 as output. The circuit 114 is particularly configured to concatenate the binary words Code1A and Code1B in the correct order in order to find the initial binary word Code1. The circuit 114 and the circuit 104 described in relation with FIG. 1 can, for example, be part of a same circuit, or as a variant can be two separate circuits.

As a variant, the parts 10 and 11 could comprise more than two memory circuits. In this case, the circuit 114 is configured to receive as many binary words as there are memory circuits comprised in the parts 10 and 11 as input. In other words, the circuit 114 is configured to receive the binary word Code1 from as many binary words as there are memory circuits comprised in the parts 10 and 11. Additionally, in this case, the circuit 107 is configured to supply as many physical addresses as necessary.

A method for reading the datum Data1 implementing the part 11 of the system 1 in memory is as follows. The processor 111 supplies the circuit 107 with the address AddL1 at which it wishes to read a datum, in the case at hand the datum Data1. The circuit 107 supplies the memories 105 and 106 with the physical addresses Add1A and Add1B coming from the logical address AddL1. The binary word Code1A is stored at the address Add1A of the memory circuit 105, and the binary word Code1B is stored at the address Add1B of the memory circuit 106. The memory circuits 105 and 106 supply the circuit 114 with the two binary words Code1A and Code1B to reform the binary word Code1. The circuit 113 is tasked with extracting the datum Data1 from the binary word Code1 and sending it to the processor 111. The circuit 112 in turn checks that there is no error, by checking the code EDC1.

One advantage of this embodiment is that, during the reading method, the circuit 112 makes it possible to detect an addressing error of the datum Data 1. Indeed, the code EDC1 being representative of the datum Data1 and the logical address AddL1 at which the datum was written, the comparison of the code EDC1 to a code generated from the logical address AddL1 supplied by the processor 111 can make it possible to detect a difference in logical addresses.

Figure 3:
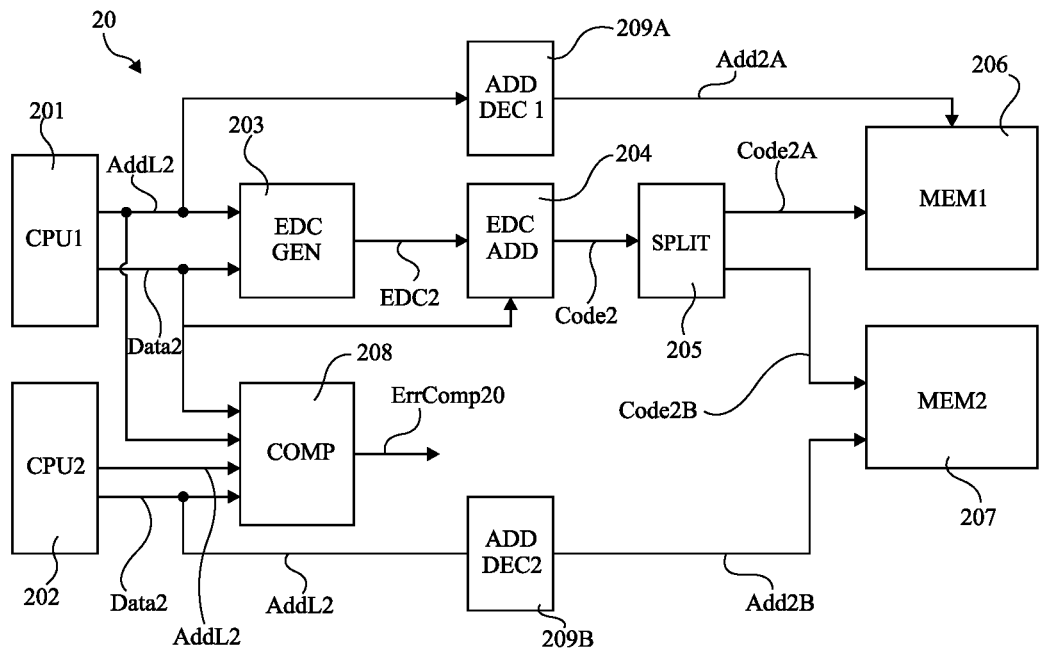
FIG. 3 shows, schematically and in block diagram form, part of an architecture of one embodiment of an electronic system.

FIG. 3 shows, schematically and in block diagram form, part 20 of an architecture of one embodiment of an electronic system 2. The part 20 is configured to write data in memory of the electronic circuit 2.

The part 20 comprises: two processors 201 (CPU1) and 202 (CPU2); a circuit 203 (EDC Gen) for generating an error correcting or detecting code; a circuit 204 (EDC ADD) for forming a binary word; a circuit 205 (SPLIT) for dividing a binary word; two memory circuits 206 (MEM1) and 207 (MEM2); two address decoding circuits 209A (ADD DEC 1) and 209B (ADD DEC 2); and a comparison circuit 208 (COMP).

The processors 201 and 202 are processors with identical structures and configured to supply the same data and controls. The processors 201 and 202 are more specifically processors configured to request the writing of data in the memories 206 and 207. Each processor 201, 202 supplies a datum Data2 and a logical address AddL2 as output. The address AddL2 is the logical address at which the datum Data2 must be written. Using two processors 201 and 202 in parallel makes it possible, inter alia, to detect errors through redundancy checks.

The circuit 203 for generating an error correcting or detecting code is a circuit identical to the circuit 102 disclosed in relation with FIG. 1. The circuit 203 receives the datum Data2 coming from the processor 201, and the logical address AddL2 coming from the processor 201, as input. The circuit 203 supplies an error correcting or detecting code EDC2 as output.

The circuit 204 for forming a binary word is a circuit identical to the circuit 103 disclosed in relation with FIG. 1. The circuit 204 receives the code EDC2 and the datum Data2 coming from the processor 201 as input, and supplies a binary word Code2 as output.

The circuit 205 for dividing a binary word is a circuit identical to the circuit 104 disclosed in relation with FIG. 1. The circuit 205 receives the binary word Code2 as input, and supplies two binary words Code2A and Code2B corresponding to two parts of the binary word Code2 as output.

The circuits 209A and 209B are circuits similar to the circuit 107 disclosed in relation with FIG. 1. The circuit 209A receives the logical address AddL2 coming from the processor 201, and supplies a physical address Add2A as output. The circuit 209B receives the logical address AddL2 coming from the processor 202, and supplies a physical address Add2B as output.

The memory circuits 206 and 207 are configured to store the binary words Code2A and Code2B respectively at the addresses Add2A and Add2B. The memory circuits 206 and 207 are memory circuits configured to store the same number of binary words. The memory circuit 206 receives the binary word Code2A as input, as well as the address Ad2A coming from the circuit 209A. The memory circuit 207 receives the binary word Code2B as input, as well as the address Ad2B coming from the circuit 209B. The memory circuits 206 and 207 are, for example, volatile memories. As an example, the memory circuits 206 and 207 are the same size.

As a variant, the part 20 could comprise more than two memory circuits with an identical structure and size. In this case, the circuit 205 would be configured to supply as many binary words of the same size as there are memory circuits comprised in the part 20. In other words, the circuit 205 is configured to divide the binary word Code2 into as many binary words as there are memory circuits comprised in the part 20. Additionally, the circuits 209A and 209B are configured, in this case, to supply as many physical addresses from the logical address AddL2 as there are memory circuits comprised in the part 20.

The comparison circuit 208 is a circuit configured to compare the data Data2 supplied by the processors 201 and 202, and the logical addresses AddL2 supplied by the processors 201 and 202. If the data Data2 transmitted by the two processors 201 and 202, or the addresses AddL2 transmitted by the two processors 201 and 202, are not the same, then an error is detected. The circuit 208 receives the data Data2 transmitted by the two processors 201 and 202 as input, as well as the addresses AddL2 transmitted by the two processors 201 and 202, and supplies an error signal ErrComp20 as output. Any error detected by the circuit 208 is transmitted via the error signal ErrComp20.

A method for writing the datum Data2 implementing the part 20 of the system 2 in memory is as follows. When the processors 201 and 202 wish to store the datum Data2 in memory, they generate the logical address AddL2 at which they wish to store it. The processor 201 then supplies the datum Data2 and the logical address AddL2 to the circuit 203 for which the latter generates the code EDC2. In parallel, the logical address AddL2 is converted into two physical addresses Add2A and Add2B respectively by the circuits 209A and 209B. The code EDC2 is therefore representative of the datum Data2 and the address AddL2 supplied by the processor 201. The datum Data2 and the code EDC2 are next used, by the circuit 204, to supply the binary word Code2. The binary word Code2 is next divided into the two binary words Code2A and Code2B, by the circuit 205. The binary words Code2A and Code2B are stored, respectively, at the address Add2A in the memory circuit 206 and the address Add2B in the memory circuit 207.

Figure 4:
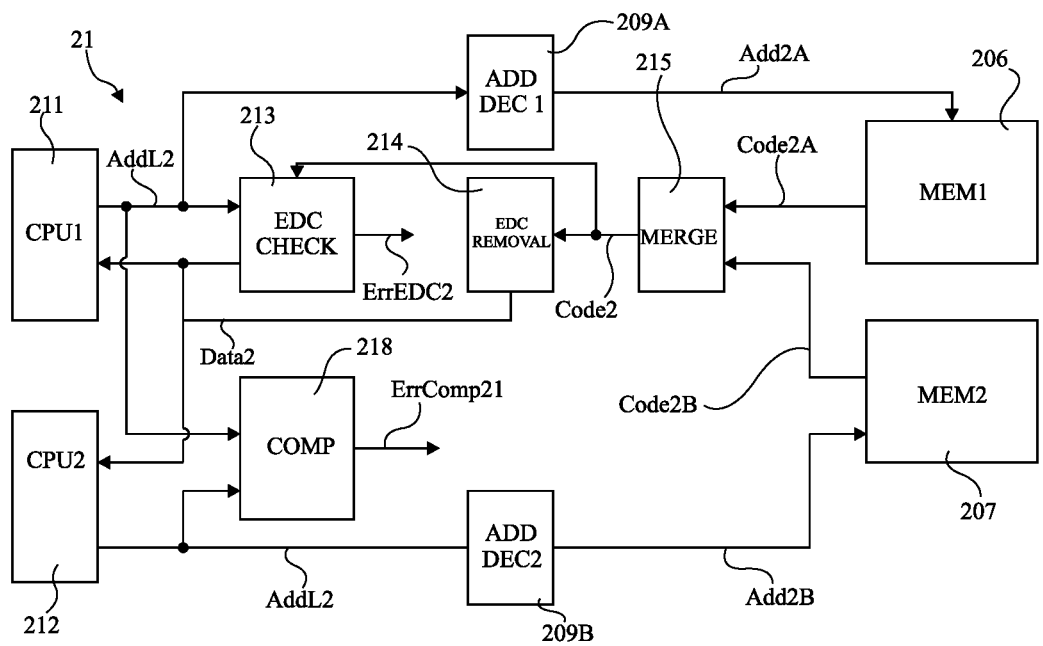
FIG. 4 shows, schematically and in block diagram form, another part of the architecture of the system of FIG. 3.

FIG. 4 shows, schematically and in block diagram form, another part 21 of the architecture of the embodiment of the electronic system 2, the part 20 of which is described in relation with FIG. 3. The part 21 is configured for writing data in memories of the electronic system 2. More specifically, in FIG. 4, the part 21 is configured to read the datum Data2 written at the logical address AddL2 as described in relation with FIG. 3.

The part 21 comprises: two processors 211 (CPU1) and 212 (CPU2); a circuit 213 (EDC CHECK) for checking an error correcting or detecting code; a circuit 214 (EDC REMOVAL) for recovering a datum; a circuit 215 (MERGE) for concatenating binary words; and the two identical memory circuits 206 (MEM1) and 207 (MEM2); the two address decoding circuits 209A (ADD DEC 1) and 209B (ADD DEC 2); and a comparison circuit 218 (COMP).

The processors 211 and 212 are processors identical to the processor 111. The processors 211 and 212 each supply, as output, the logical address AddL2 at which they wish to read a datum, and each receive the datum Data2. The processors 211 and 212 are, for example, the same processors as the processors 201 and 202 described in relation with FIG. 3, but as a variant, the processors 211 and 212 can be separate processors from the processors 201 and 202.

The circuit 213 for checking an error correcting or detecting code is a circuit identical to the circuit 112 disclosed in relation with FIG. 2. The circuit 213 receives the logical address AddL2 transmitted by the processor 211 and the binary word Code2 as input, and supplies an error signal ErrEDC2 as output. The circuit 213 and the circuit 203 described in relation with FIG. 3 can, for example, be part of a same circuit, or as a variant can be two separate circuits.

The circuit 214 for recovering a datum is a circuit identical to the circuit 113 disclosed in relation with FIG. 2. The circuit 214 receives the binary word Code2 as input, and supplies the datum Data2 as output.

The circuit 215 for concatenating binary words is a circuit identical to the circuit 114 disclosed in relation with FIG. 2. The circuit 215 receives the two binary words Code2A and Code2B as input, and supplies the binary word Code2 as output. The circuit 215 and the circuit 205 described in relation with FIG. 3 can, for example, be part of a same circuit, or as a variant can be separate circuits.

The circuits 209A and 209B convert the logical address AddL2 respectively into the physical addresses Add2A and Add2B. The circuit 209A receives the logical address AddL2 coming from the processor 211, and supplies the physical address Add2A as output. The circuit 209B receives the logical address AddL2 coming from the processor 212, and supplies the physical address Add2B as output.

The memory circuits 206 and 207 store the binary words Code2A and Code2B respectively at the addresses Add2A and Add2B. The memory circuit 206 receives the address Add2A from the circuit 209A, and the memory circuit 207 receives the address Add2B from the circuit 209B.

As a variant, the parts 20 and 21 could comprise more than two memory circuits. In this case, the circuit 215 is configured to receive as many binary words as there are memory circuits comprised in the parts 20 and 21 as input. In other words, the circuit 215 is configured to receive the binary word Code2 from as many binary words as there are memory circuits comprised in the parts 20 and 21. Additionally, the circuits 209A and 209B are configured to supply as many physical addresses from the logical address AddL2 as there are memory circuits present in the parts 20 and 21.

The comparison circuit 218 is a circuit configured to compare the logical addresses AddL2 transmitted by the processors 211 and 212. The comparison circuit 218 receives the address AddL2 supplied by the processor 211 and the address AddL2 supplied by the processor 212 as input, and supplies an error signal ErrComp21 as output. If the logical addresses transmitted by the processors 211 and 212 are not identical, than an error is detected, and is transmitted by the error signal ErrComp21. The circuit 218 and the circuit 208 described in relation with FIG. 3 can, for example, be part of a same circuit, but, as a variant, the circuits 208 and 218 can be separate circuits.

A method for reading the datum Data2 implementing the part 21 of the system 2 in memory is as follows. The processors 211 and 212 supply the circuits 209A and 209B with the address AddL2 at which they wish to read a datum, in the case at hand the datum Data2. The circuits 209A and 209B supply the physical addresses Add2A and Add2B to the memory circuits 206 and 207. The comparison circuit 218 checks whether the processors 211 and 212 are transmitting the same logical address AddL2. The binary word Code2A is stored at the address Add2A of the memory circuit 206, and the binary word Code2B is stored at the address Add2B of the memory circuit 207. The memory circuits 206 and 207 supply the circuit 215 with the two binary words Code2A and Code2B to reform the binary word Code2. The circuit 214 occupies itself finding the datum Data2 and transmitting it to the processors 211 and 212. The circuit 213 in turn checks that there is no error.

One advantage of this embodiment is that, during the reading method, the circuit 213 makes it possible to detect an addressing error of the datum Data2. Indeed, the code EDC2 being representative of the datum Data2 and the logical address at which the datum was written, the comparison of the code EDC2 to a code generated from the logical address AddL2 supplied by the processor 211 can make it possible to detect a difference in logical addresses.

Another advantage of this embodiment is that using two processors 201 and 202, and 211 and 212, in parallel makes it possible to detect the errors emitted during the reading command or the writing command. These errors are detected by the circuits 208 and 218.

Figure 5:
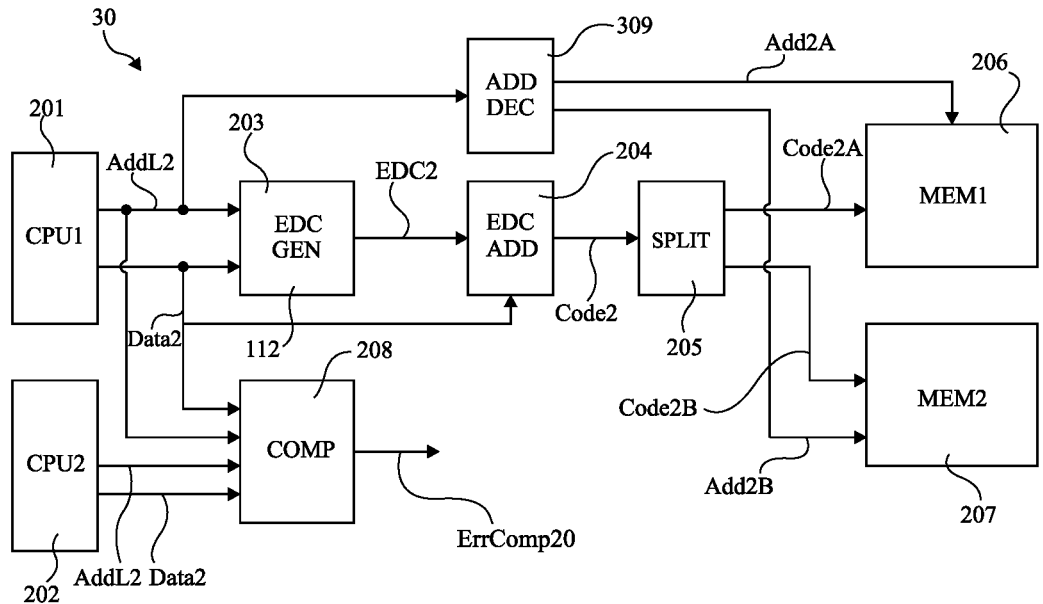
FIG. 5 shows, schematically and in block diagram form, part of an architecture of one embodiment of an electronic system.

FIG. 5 shows, schematically and in block diagram form, part 30 of an architecture of one embodiment of an electronic system 3. The part 30 is configured to write data in memory of the electronic circuit 3.

The electronic system 3 is similar to the electronic system 2, the parts 20 and 21 of which are described in relation with FIGS. 3 and 4. The elements shared by the systems 2 and 3 will not be described again hereinafter.

The part 30 comprises substantially the same circuits as the part 20 of the system 2. Thus, the part 30 comprises: two processors 201 (CPU1) and 202 (CPU2); a circuit 203 (EDC Gen) for generating an error correcting or detecting code; a circuit 204 (EDC ADD) for forming a binary word; a circuit 205 (SPLIT) for dividing a binary word; two identical memory circuits 206 (MEM1) and 207 (MEM2); an address decoding circuit 309 (ADD DEC); and a comparison circuit 208 (COMP).

The difference between the part 20 of the system 2 and the part 30 of the system 3 is that, in the part 30, the logical address AddL2 is transmitted by the processor 201 to the circuit 309, which is identical to the circuit 107 described in relation with FIG. 1. The circuit 309 supplies the two physical addresses Add2A and Add2B as output. The two memory circuits 206 and 207 respectively receive the physical addresses Add2A and Add2B from the circuit 309. In the part 20, each memory circuit receives the physical address Add2A or Add2B from a different decoding circuit. In this embodiment, the processor 202 only supplies the logical address AddL2 to the comparison circuit 208.

Figure 6:
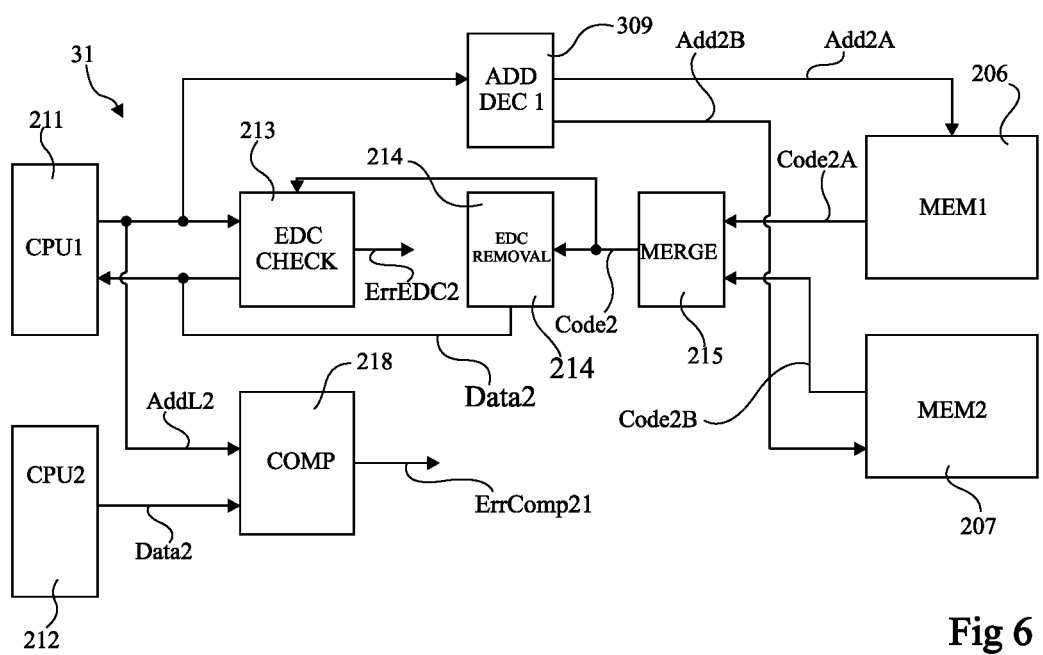
FIG. 6 shows, schematically and in block diagram form, another part of the architecture of the system of FIG. 5.

FIG. 6 shows, schematically and in block diagram form, another part 31 of the architecture of the embodiment of the electronic system 3, the part 30 of which is described in relation with FIG. 5. The electronic system 3 is a preferred embodiment. The part 31 is configured for writing data in memories of the electronic system 3. More specifically, in FIG. 6, the part 31 is configured to read the datum Data2 written at the address AddL2 as described in relation with FIG. 3.

The electronic system 3 is similar to the electronic system 2, the parts 20 and 21 of which are disclosed in relation with FIGS. 3 and 4. The elements shared by the systems 2 and 3 will not be described again hereinafter.

The part 31 comprises some of the circuits of the part 21 of the system 2. Thus, the part 31 comprises: two processors 211 (CPU1) and 212 (CPU2); the circuit 213 (EDC CHECK) for checking an error correcting or detecting code; the circuit 214 (EDC REMOVAL) for recovering a datum; the circuit 215 (MERGE) for concatenating binary words; and the two identical memory circuits 206 (MEM1) and 207 (MEM2); the address decoding circuit 309 (ADD DEC); and the comparison circuit 218 (COMP).

The difference between the part 21 of the system 2 and the part 31 of the system 3 is that, in the part 31, the two memory circuits 206 and 207 receive the addresses Add2A and Add2B from the circuit 309. In the part 20, each memory circuit receives the address Add2A or Add2B from a different address decoding circuit. In this embodiment, the processor 212 only supplies the logical address AddL2 to the comparison circuit 218.

One advantage of this embodiment is that, during the reading method, the circuit 213 makes it possible to detect an addressing error of the datum Data2. Indeed, the code EDC2 being representative of the datum Data2 and the logical address at which the datum was written, the comparison of the code EDC2 to a code generated from the logical address AddL2 supplied by the processor 211 makes it possible to detect a difference in logical addresses.

Another advantage of this embodiment is that the two binary words Code2A and Code2B are written at physical addresses Add2A and Add2B, coming from the same logical address AddL2, in memory circuits 206 and 207, even if the logical addresses AddL2 transmitted by the processors 201 and 202 are different in error.

Figure 7:
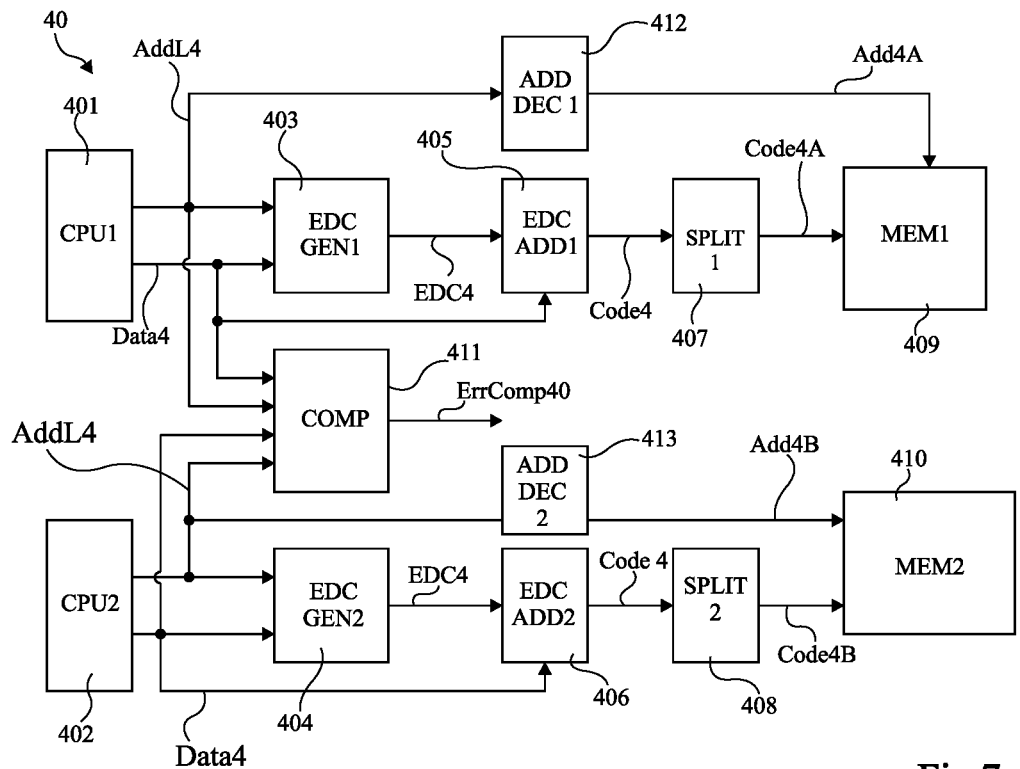
FIG. 7 shows, schematically and in block diagram form, part of an architecture of another embodiment of an electronic system.

FIG. 7 shows, schematically and in block diagram form, part 40 of an architecture of one embodiment of an electronic system 4. The part 40 is configured to write data in memory of the electronic circuit 4.

The part 40 comprises: two processors 401 (CPU1) and 402 (CPU2); two circuits 403 (EDC GEN 1) and 404 (EDC GEN 2) for generating an error correcting or detecting code; two circuits 405 (EDC ADD1) and 406 (EDC ADD 2) for forming a binary word; circuits 407 (SPLIT 1) and 408 (SPLIT 2) for dividing a binary word; two identical memory circuits 409 (MEM1) and 410 (MEM2); two address decoding circuits 412 (ADD DEC 1) and 413 (ADD DEC2); and a comparison circuit 411 (COMP).

The processors 401 and 402 are similar to the processors 201 and 202 of the part 20 of the system 2 described in relation with FIG. 3. The processors 401 and 402 have identical structures and configured to supply the same data and controls. The processors 401 and 402 are more specifically processors configured to request the writing of data in the memories 409 and 410. Each processor 401, 402 supplies a datum Data4 to be written in memory and a logical address AddL4 as output. The address AddL4 is the logical address at which the datum Data4 must be written in memory. Using two processors 401 and 402 in parallel makes it possible, inter alia, to detect errors through redundancy checks.

The circuits 403 and 404 for generating an error correcting or detecting code are circuits identical to the circuits 102 disclosed in relation with FIG. 1. The circuit 403 receives the datum Data4 and the logical address AddL4 both coming from the processor 401 as input, and supplies a code EDC4 as output. The circuit 404 receives the datum Data4 and the logical address AddL4 both coming from the processor 402 as input, and supplies an error correcting or detecting code EDC4 as output.

The circuits 405 and 406 for forming a binary word are circuits identical to the circuit 103 disclosed in relation with FIG. 1. The circuit 405 receives the code EDC4 coming from the circuit 403 as input, and supplies the binary word Code4 as output. The circuit 406 receives the code EDC4 coming from the circuit 404 as input, and supplies the binary word Code4 as output.

The circuits 407 and 408 for dividing a binary word are circuits configured to divide the binary word Code4 into several binary words. The circuit 407 receives the binary word Code4 coming from the circuit 405 as input, and in this example supplies the binary word Code4 and the binary word Code2A as output. The circuit 408 receives the binary word Code4 coming from the circuit 406 as input, and in this example supplies the binary word Code4 and the binary word Code2B as output.

The address decoding circuits 412 and 413 are circuits identical to the circuit 107 disclosed in relation with FIG. 1.

The circuits 412 and 413 convert the logical address AddL4 respectively into the physical addresses Add4A and Add4B. The circuit 412 receives the logical address AddL4 coming from the processor 401, and supplies the physical address Add4A as output. The circuit 413 receives the logical address AddL4 coming from the processor 402, and supplies the physical address Add4B as output.

The memory circuits 409 and 410 are memory circuits identical to the memory circuits 105 and 106 disclosed in relation with FIG. 1. The memory circuit 409 receives the binary word Code4A coming from the circuit 407 as input, as well as the address Add4A coming from the circuit 412. The memory circuit 410 receives the binary word Code4B coming from the circuit 408 as input, as well as the address Add4B coming from the circuit 413. As an example, the memory circuits 409 and 410 are the same size.

As a variant, the part 40 could comprise more than two memory circuits. In this case, the part 40 comprises as many circuits for generating an error correcting or detecting code, as many circuits for forming a binary word, and as many circuits for dividing a binary word as there are memory circuits in the part 40. Additionally, the binary word dividing circuits are configured to divide the binary word that they receive as input into a number of binary words equivalent to the number of memory circuits comprised in the part 40. The address decoding circuits 412 and 413 are configured to supply as many physical addresses as there are memory circuits comprised in the part 40.

The comparison circuit 411 is a circuit identical to the circuit 208 disclosed in relation with FIG. 3. The circuit 411 receives the data Data4 transmitted by the processors 401 and 402 as input, as well as the addresses AddL4 transmitted by the processors 401 and 402. The circuit 411 supplies an error signal ErrComp40 as output.

A method for writing the datum Data4 implementing the part 40 of the system 4 in memory is as follows. When the processors 401 and 402 wish to store the datum Data4 in memory, they generate the logical address AddL4 at which they wish to store it. The processor 401, respectively 402, then supplies the datum Data4 and the logical address AddL4 to the circuit 403, respectively 404, for which the latter generates the code EDC4. In parallel, the processor 401, respectively 402, supplies the address AddL4 to the circuit 412, respectively 413, to obtain the physical address Add4A, respectively Add4B. The code EDC4 is therefore representative of the datum Data4 and the logical address AddL4 supplied by the processors 401 and 402. The circuit 405 next generates the binary word Code4 from the code EDC4 supplied by the circuit 403 and from the datum Data4 supplied by the processor 401. The circuit 406 next generates the binary word Code4 from the code EDC4 supplied by the circuit 404 and from the datum Data4 supplied by the processor 402. The circuits 407 and 408 divide the binary words Code4, respectively received from the circuits 405 and 406, into the binary words Code4A and Code4B. The binary word Code4A is stored in the memory 409 at the address Add4A transmitted by the circuit 412, and the binary word Code4B is stored in the memory 410 at the address Add4B transmitted by the circuit 413.

Figure 8:
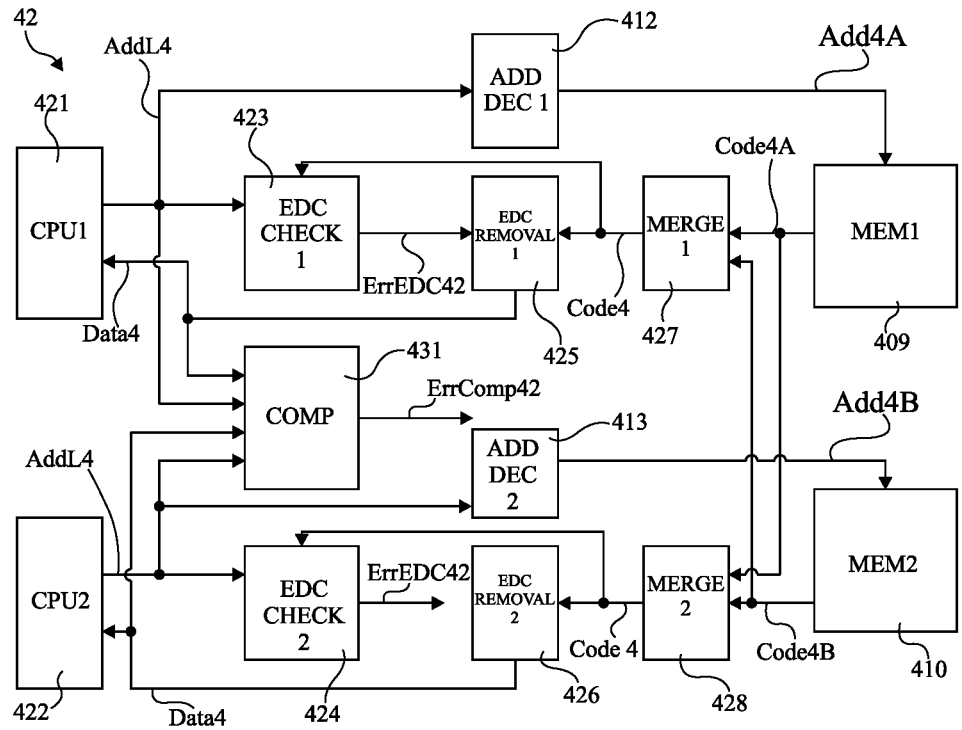
FIG. 8 shows, schematically and in block diagram form, another part of the architecture of the system of FIG. 7.

FIG. 8 shows, schematically and in block diagram form, another part 42 of the architecture of the embodiment of the electronic system 4, the part 40 of which is described in relation with FIG. 7. The part 42 is configured for writing data in memories of the electronic system 4. More specifically, in FIG. 8, the part 42 is configured to read the datum Data4 written at the logical address AddL4 in the memory circuits 409 and 410 as described in relation with FIG. 7.

The part 42 comprises: two processors 421 (CPU1) and 422 (CPU2); circuits 423 (EDC CHECK 1) and 424 (EDC CHECK 2) for checking an error correcting or detecting code; circuits 425 (EDC REMOVAL 1) and 426 (EDC REMOVAL 2) for recovering a datum; circuits 427 (MERGE 1) and 428 (MERGE 2) for concatenating binary words; and the two memory circuits 409 (MEM1) and 410 (MEM2); the two address decoding circuits 412 (ADD DEC 1) and 413 (ADD DEC 2); and a comparison circuit 431 (COMP).

The two processors 421 and 422 are processors identical to the processors 211 and 212 disclosed in relation with FIG. 4. The processors 421 and 422 each supply, as output, the logical address AddL4 at which they wish to read a datum, and each receive the datum Data4. The processors 421 and 422 are, for example, the same processors as the processors 401 and 402, but as a variant, the processors 421 and 422 can be separate processors from the processors 401 and 402.

The circuits 423 and 424 for checking an error correcting or detecting code are circuits identical to the circuit 112 disclosed in relation with FIG. 2. The circuit 423 receives the logical address AddL4 coming from the processor 421 and the binary word Code4 coming from the circuit 427 as input, and supplies an error signal ErrEDC42 as output. The circuit 424 receives the address AddL4 coming from the processor 422 and the binary word Code4 coming from the circuit 428 as input, and supplies an error signal ErrEDC42 as output. The circuits 403 and 423 can, for example, be part of a same circuit, but, as a variant, can be separate circuits. The circuits 404 and 424 can, for example, be part of a same circuit, but, as a variant, can be separate circuits.

The circuits 425 and 426 for recovering a datum are circuits identical to the circuit 113 disclosed in relation with FIG. 2. The circuit 425 receives the binary word Code4 coming from the circuit 427 as input, and supplies the datum Data4 as output. The circuit 426 receives the binary word Code4 coming from the circuit 428 as input, and supplies the datum Data4 as output. The circuits 405 and 425 can, for example, be part of a same circuit, but, as a variant, can be separate circuits. The circuits 406 and 426 can, for example, be part of a same circuit, but, as a variant, can be separate circuits.

The binary word concatenation circuits 427 and 428 are circuits identical to the circuit 114 disclosed in relation with FIG. 2. The circuit 427 receives the binary words Code4A and Code4B as input, and supplies the binary word Code4 as output. The circuit 428 receives the binary words Code4A and Code4B as input, and supplies the binary word Code4 as output. The circuits 407 and 427 can, for example, be part of a same circuit, but, as a variant, can be separate circuits. The circuits 408 and 428 can, for example, be part of a same circuit, but, as a variant, can be separate circuits.

The circuits 412 and 413 convert the address AddL4 respectively into the physical addresses Add4A and Add4B. The circuit 412 receives the logical address AddL4 as input, and supplies the physical address Add4A as output. The circuit 413 receives the logical address AddL4 as input, and supplies the physical address Add4B as output.

The memory circuits 409 and 410 store the binary words Code4A and Code4B respectively at the addresses Add4A and Add4B. The memory circuit 409 receives the address Add4A from the circuit 412, and the memory circuit 410 receives the address Add4B from the circuit 413.

As a variant, the parts 40 and 42 could comprise more than two memory circuits. In this case, the part 42 comprises as many circuits for checking an error correcting or detecting code, as many circuits for recovering a datum, and as many binary word concatenation circuits as there are memory circuits in the part 41. Additionally, the binary word dividing circuits are configured to divide the binary word that they receive as input into a number of binary words equivalent to the number of memory circuits comprised in the part 41. Additionally, the circuits 412 and 413 are configured to supply as many physical addresses coming from the logical address AddL4 as there are memory circuits comprised in the part 42.

The comparison circuit 431 is a circuit configured to compare, inter alia, the addresses AddL4 transmitted by the processors 421 and 422, and the data Data4 transmitted by the circuits 425 and 426. The comparison circuit 431 receives the address AddL4 supplied by the processor 421 and the address AddL4 supplied by the processor 422 as input, and the datum Data4 transmitted by the circuit 425 and the datum Data4 transmitted by the circuit 426 as output. The comparison circuit 431 supplies an error signal ErrComp42 as output. If the addresses transmitted by the processors 421 and 422 are not identical, than an error is detected, and is transmitted by the error signal ErrComp42. The circuit 431 and the circuit 411 described in relation with FIG. 7 can, for example, be part of a same circuit, but, as a variant, the circuits 411 and 431 can be separate circuits.

A method for reading the datum Data4 implementing the part 42 of the system 4 in memory is as follows. The processors 421 and 422 supply the circuits 412 and 413 with the address AddL4 at which they wish to read a datum, in the case at hand the datum Data4. The circuits 412 and 413 supply the physical addresses Add4A and Add4B to the memory circuits 409 and 410. The comparison circuit 431 checks whether the processors 421 and 422 are transmitting the same address AddL4. The binary word Code4A is stored at the address Add4A of the memory circuit 409, and the binary word Code4B is stored at the address Add4B of the memory circuit 410. The memory circuits 409 and 410 supply the circuits 427 and 428 with the two binary words Code4A and Code4B to reform the binary word Code4. The circuit 425 occupies itself finding the datum Data4 from the binary word Code4 transmitted by the circuit 427, the circuit 426 occupies itself finding the datum Data4 from the binary word Code4 transmitted by the circuit 428. The processor 421 then receives the datum Data4 from the circuit 425, and the processor 422 receives the datum Data4 from the circuit 426. The comparison circuit 431 checks the correspondence between the data Data4 supplied to the processors 421 and 422. The circuits 423 and 424 check, each on its side, the code EDC4.

One advantage of this embodiment is that, during the reading method, the circuits 423 and 424 make it possible to detect an addressing error of the datum Data4. Indeed, the code EDC4 being representative of the datum Data4 and the logical address at which the datum was written, the comparison of the code EDC4 to a code generated from the logical address AddL4 supplied by the processor 421 and 422 makes it possible to detect a difference in addresses.

Another advantage of this embodiment is that using two processors 401 and 402, and 421 and 422, in parallel makes it possible to detect the errors emitted during the reading control or the writing control. These errors are detected by the circuits 411 and 431.

Figure 9:
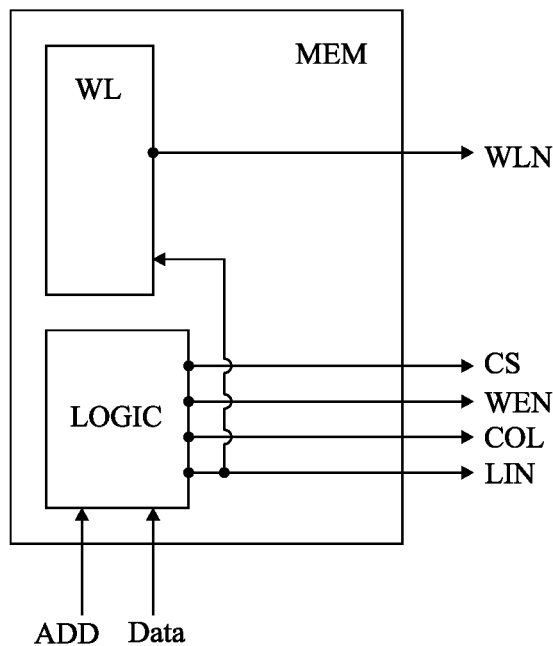
FIG. 9 shows, schematically and in block diagram form, part of an architecture of a memory circuit.

FIG. 9 shows, schematically and in block diagram form, part of a memory circuit MEM. The memory circuit MEM is, for example, the memory circuit type used by the systems 1 to 4 disclosed in relation with FIGS. 1 to 8.

The part of the memory circuit MEM comprises a control circuit LOGIC and a line control circuit WL.

The control circuit LOGIC is a circuit configured to process the various controls received from the system to which the memory circuit MEM belongs. The circuit LOGIC receives, as input, an address Add and a datum Data to be written. The circuit LOGIC supplies the following signals as output: a signal CS for selecting the memory circuit MEM; a signal WEN for activating writing; a selection/column number signal COL; and a selection/row number signal LIN.

The address Add is preferably a physical address, that is to say, able to be interpreted directly into row and column coordinates in the memory circuit. In a variant, this address is a logical address supplied by the processor and translated by an address decoding circuit associated with the memory circuit, that is to say, belonging to the memory circuit.

The signal CS makes it possible to select the memory circuit MEM during a reading or writing operation.

The signal WEN makes it possible to indicate the nature of the received control to the memory circuit MEM, and more specifically, whether a writing operation is requested.

The signals COL and LIN are the signals generated from the address Add received by the circuit LOGIC, and are the signals making it possible to select the memory points (not shown in FIG. 9) of the memory circuit in which one wishes to write the datum Data.

The row control circuit WL is a circuit configured to select the wordline corresponding to the address Add received by the memory circuit. The circuit WL receives the row selection/number signal LIN as input, and supplies words WLN as output. In FIG. 9, only one word WLN is shown.

Figure 10:
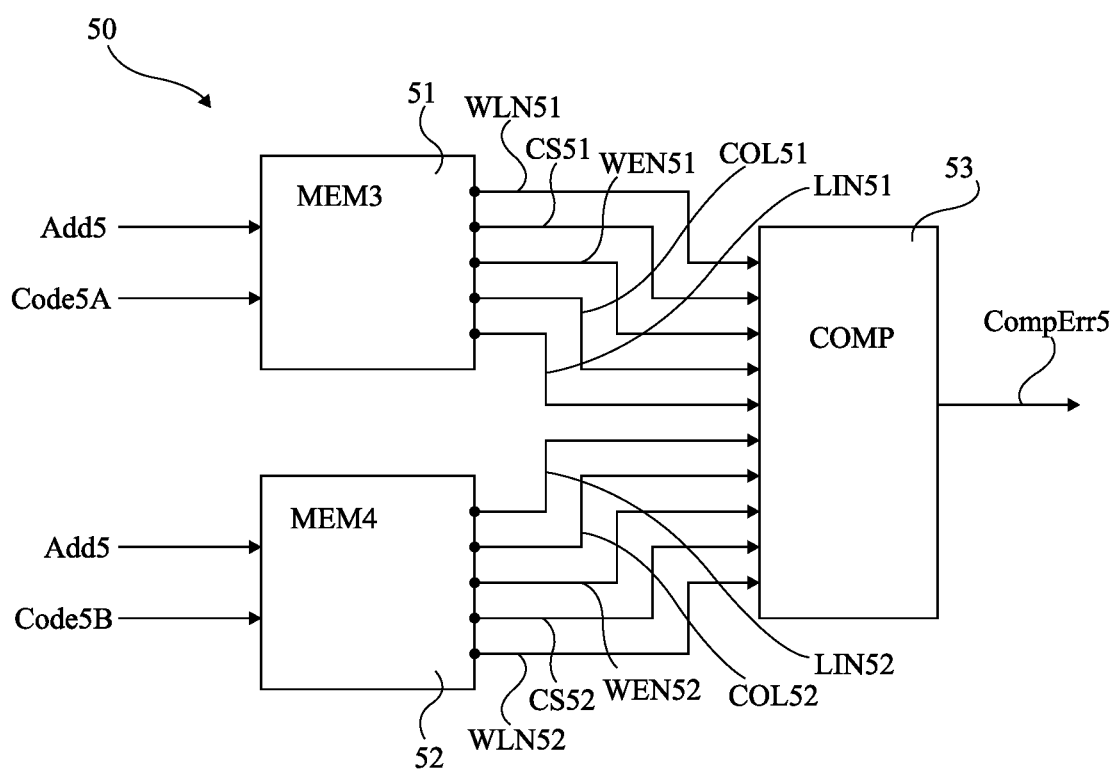
FIG. 10 shows, schematically and in block diagram form, part of the architecture of another embodiment of an electronic system.

FIG. 10 shows, schematically and in block diagram form, part 50 of an architecture of an electronic system 5. The part 50 is configured to detect errors when writing data in memories.

The part 50 of the system 5 comprises: two memory circuits 51 (MEM3) and 52 (MEM4); and a comparison circuit 53 (COMP).

The memory circuits 51 and 52 are memory circuits with an identical structure and size to the type of the memory MEM disclosed in relation with FIG. 9. Thus, the memory circuits 51 and 52 each receive a physical address Add5 as input. The memory circuit 51 further receives a binary word Code5A to be stored at the address Add5 as input. The memory circuit 52 further receives a binary word Code5B to be stored at the address Add5 as input. As disclosed in relation with FIG. 9, each memory circuit 51, respectively 52, supplies the following output signals as output: a word WLN51, respectively WLN52; a signal CS51, respectively CS52, for selecting the memory circuit 51, respectively the memory circuit 52; a signal WEN51, respectively WEN52, for activating writing; a selection/column number signal COL51, respectively COL52; and a selection/row number signal LIN51, respectively LIN52.

The binary words Code5A and Code5B are binary words of equal size both representative of a datum to be written in memory. As an example, the binary words Code5A and Code5B are obtained by dividing the datum to be written in memory in half. According to another example, the binary words Code5A and Code5B are obtained in the same way as the binary words Code1A and Code1B described in relation with FIG. 1.

The comparison circuit 53 is a circuit making it possible to compare the output signals of the two memory circuits 51 and 52 in order to detect an error during a writing operation. The comparison circuit 53 receives the following signals as input: the words WLN51 and WLN52; the signals CS51 and CS52; the signals WEN51 and WEN52; the signals COL51 and COL52; and the signals LIN51 and LIN52.

The comparison circuit 53 supplies a comparison signal CompErr5 as output. The comparison circuit 53 more particularly compares each output signal of the memory circuit 51 with the counterpart output signal of the memory 52. In other words, the comparison circuit 53 is configured to: compare the words WLN51 and WLN52; compare the signals CS51 and CS52; compare the signals WEN51 and WEN52; compare the signals COL51 and COL52; and compare the signals LIN51 and LIN52.

The comparison circuit 53 can be an assembly of logic gates of the EXCLUSIVE OR type.

As a variant, the part 50 could comprise more than two memory circuits. In this case, the comparison circuit 53 is configured to receive all of the output signals of the memory circuits of the part 50 as input. Additionally, each of these memory circuits is configured to store a binary word representative of the datum to be written in memory different from the binary words stored in the other memory circuits.

A method for detecting reading errors implementing the part 50 of the system 5 is as follows. During the writing of the binary words Code5A and Code5B in the memory circuits 51 and 52 at the address Add5, the memory circuits 51 and 52 send their output signals to the comparison circuit 53. The binary words Code5A and Code5B being binary words of equal size, stored at an identical address in identical memory circuits, thus, the output signals of the memory circuits 51 and 52 should therefore be identical. The comparison circuit 53 then compares the output signals of the memory circuits 51 and 52, each difference between two signals being able to signify an error. A potential error is transmitted by means of the signal CompErr5.

One advantage of this embodiment is that it makes it possible to detect the address errors during a writing operation of a datum in memory without requiring a reading operation of said datum.

Various embodiments and variants have been described. Those skilled in the art will understand that certain features of these embodiments can be combined and other variants will readily occur to those skilled in the art.

In particular, the embodiments disclosed in relation with FIGS. 1 and 2, 3 and 4, 5 and 6, and 7 and 8 are all compatible with the embodiment disclosed in relation with FIGS. 9 and 10.

Additionally, the embodiments disclosed in relation with FIGS. 3 and 4, 5 and 6, and 7 and 8 comprise two identical processors, but as a variant, these embodiments could comprise more than two processors.

Finally, the practical implementation of the embodiments and variants described herein is within the capabilities of those skilled in the art based on the functional description provided hereinabove.

The invention claimed is:

1. A system, comprising:
   a first memory circuit;
   a second memory circuit;
   wherein said second memory circuit is different from said first memory circuit;
   a data writing circuit comprising:
   an error detection and correction circuit configured to receive a datum and a logical address and generate therefrom an error correcting code;
   an adding circuit configured to combine the datum and error correcting code to generate a word; and
   a splitting circuit configured to split the word into a first part and a second part and then store the first part at the logical address in the first memory circuit and store the second part at said logical address in the second memory circuit.

2. The system according to claim 1, wherein said first part and said second part each have a same size.

3. The system according to claim 1, wherein the word is a concatenation of said datum and said error correcting code.

4. The system according to claim 1, further comprising a processor configured to supply the datum and the logical address.

5. The system according to claim 1, further comprising a first processor configured to supply the datum and the logical address, and a second processor configured to supply the datum and the logical address.

6. The system according to claim 5, further comprising a comparator circuit configured to compare said datum supplied by the first processor to said datum supplied by the second processor.

7. The system according to claim 5, further comprising a comparator circuit configured to compare said logical address supplied by the first processor to said logical address supplied by the second processor.

8. The system according to claim 5, wherein the first processor is configured to supply said logical address to the first memory circuit, and wherein the second processor is configured to supply said logical address to the second memory circuit.

9. The system according to claim 5, wherein the second processor is configured to supply said logical address to both the first and second memory circuits.

10. The system according to claim 1, wherein said first memory circuit and said second memory circuit each have a same size.

11. The system according to claim 1, wherein said second memory circuit is configured to store as many words as said first memory circuit.

12. The system according to claim 1, further comprising a comparator circuit configured to compare internal control signals of the first and second memory circuits.

13. The system according to claim 1, further comprising a data reading circuit configured to read the word by:
reading said first part at the logical address from the first memory circuit; and
reading said second part at said logical address from the second memory circuit.

14. The system according to claim 13, wherein data reading circuit is further configured to concatenate said first and second parts to form a read word.

15. The system according to claim 14, further comprising an error correction circuit configured to obtain the datum by removing the error correcting code from the read word.

16. The system according to claim 15, wherein said error correction circuit is further configured to process the read word to detect and correct error in the datum.

17. A system, comprising:
a first memory circuit;
a second memory circuit;
wherein said second memory circuit is different from said first memory circuit;
wherein a word comprises a first part and a second part, with the first part stored at a logical address in the first memory circuit and the second part stored at said logical address in the second memory circuit; and
a data reading circuit configured to read the word by:
reading said first part at the logical address from the first memory circuit; and
reading said second part at said logical address from the second memory circuit; and
wherein the word formed by the first and second parts comprises a datum and an error correcting code derived from both the datum and the logical address.

18. The system according to claim 17, wherein data reading circuit is further configured to concatenate said first and second parts to form a read word.

19. The system according to claim 18, further comprising an error correction circuit configured to obtain the datum by removing the error correcting code from the read word.

20. The system according to claim 19, wherein said error correction circuit is further configured to process the read word to detect and correct error in the datum using the error correcting code.

21. The system according to claim 19, wherein the word is a concatenation of said datum and said error correcting code.

22. The system according to claim 17, wherein said first part and said second part each have a same size.

23. The system according to claim 17, wherein said first memory circuit and said second memory circuit each have a same size.

24. The system according to claim 17, wherein said second memory circuit is configured to store as many words as said first memory circuit.

* * * * *